US012563692B2

(12) United States Patent
Yuan et al.

(10) Patent No.: US 12,563,692 B2
(45) Date of Patent: Feb. 24, 2026

(54) SERVER DEVICE

(71) Applicants: SQ TECHNOLOGY(SHANGHAI) CORPORATION, Shanghai (CN); INVENTEC CORPORATION, Taipei City (TW)

(72) Inventors: JiaQi Yuan, Shanghai (CN); Zhao Geng, Shanghai City (CN); Guang-Zhao Tian, Shanghai City (CN); Wei Wang, Shanghai City (CN); Hong-Chou Lin, Taipei City (TW); Yu-Fan Chen, Taipei City (TW)

(73) Assignees: SQ TECHNOLOGY(SHANGHAI) CORPORATION, Shanghai (CN); INVENTEC CORPORATION, Taipei City (TW)

( * ) Notice: Subject to any disclaimer, the term of this patent is extended or adjusted under 35 U.S.C. 154(b) by 73 days.

(21) Appl. No.: 18/747,025

(22) Filed: Jun. 18, 2024

(65) Prior Publication Data

US 2025/0380372 A1 Dec. 11, 2025

(30) Foreign Application Priority Data

Jun. 5, 2024 (CN) .......................... 202410728013.4

(51) Int. Cl.
*H05K 7/14* (2006.01)

(52) U.S. Cl.
CPC ......... *H05K 7/1487* (2013.01); *H05K 7/1492* (2013.01)

(58) Field of Classification Search
CPC .. H05K 7/1485; H05K 7/1487; H05K 7/1488; H05K 7/1489
USPC ................................................. 361/724–728
See application file for complete search history.

(56) References Cited

U.S. PATENT DOCUMENTS

| | | | | |
|---|---|---|---|---|
| 5,945,746 A | * | 8/1999 | Tracewell | H05K 7/20572 |
| | | | | 165/185 |
| 6,814,582 B2 | * | 11/2004 | Vadasz | H01R 12/721 |
| | | | | 439/607.05 |
| 7,630,212 B2 | * | 12/2009 | Fan | G06F 1/185 |
| | | | | 361/801 |
| 8,289,692 B2 | * | 10/2012 | Franz | G06F 1/183 |
| | | | | 361/679.33 |
| 8,295,051 B2 | * | 10/2012 | Cheng | G06F 1/20 |
| | | | | 361/679.48 |
| 9,141,156 B2 | * | 9/2015 | Ross | H05K 7/20736 |
| 9,913,394 B2 | * | 3/2018 | Blume | H05K 7/1424 |
| 10,628,368 B2 | * | 4/2020 | Arnouse | H05K 7/1488 |
| 11,985,780 B2 | * | 5/2024 | Zhang | H05K 5/0286 |
| 2003/0224630 A1 | * | 12/2003 | Dean | G06F 1/184 |
| | | | | 439/74 |
| 2008/0043405 A1 | * | 2/2008 | Lee | H05K 7/1445 |
| | | | | 361/679.48 |

(Continued)

*Primary Examiner* — Adrian S Wilson
(74) *Attorney, Agent, or Firm* — Maschoff Brennan

(57) ABSTRACT

A server device includes a chassis, a processor assembly, a graphics card assembly and a backplane. The processor assembly is disposed in the chassis. The graphics card assembly is disposed in the chassis. The processor assembly and the graphics card assembly are arranged vertically. The backplane is vertically disposed in the chassis. The processor assembly and the graphics card assembly are electrically connected to the backplane in a board-to-board manner.

9 Claims, 5 Drawing Sheets

(56)        References Cited

U.S. PATENT DOCUMENTS

| | | | |
|---|---|---|---|
| 2012/0170890 A1* | 7/2012 | Benton | G02B 6/4261 |
| | | | 385/31 |
| 2012/0243160 A1* | 9/2012 | Nguyen | G06F 1/1601 |
| | | | 361/679.08 |
| 2013/0107454 A1* | 5/2013 | Wilke | H05K 7/20727 |
| | | | 361/694 |
| 2016/0262282 A1* | 9/2016 | Li | H05K 7/1489 |
| 2017/0331766 A1* | 11/2017 | Schmidtke | H05K 7/1488 |

* cited by examiner

11

16

14

172

19

13

12

10

16

162

161

SERVER DEVICE

CROSS-REFERENCE TO RELATED APPLICATIONS

This non-provisional application claims priority under 35 U.S.C. § 119(a) on Patent Application No(s). 202410728013.4 filed in China, on Jun. 5, 2024, the entire contents of which are hereby incorporated by reference.

BACKGROUND OF THE INVENTION

Technical Field of the Invention

The invention relates to a server device, more particularly to a server device including a processor assembly, a graphics card assembly and a backplane.

Description of the Related Art

Nowadays, with the rapid development of the information technology, most of enterprises may do various tasks on the business via a server, such as storing data. Accordingly, the efficiency of doing tasks on the business is improved.

Generally, the server may include multiple electronic assemblies such as a CPU assembly, a graphics card assembly and a power supply assembly. The operation of the server may be realized via the electrical connections between the electronic assemblies. However, the conventional server is difficult to be assembled due to the complex configuration of the electronic assemblies disposed therein. In addition, most of the conventional electronic assemblies are electrically connected via multiple cables, thereby further increasing the complexity of the configuration within the server. Therefore, how to simplify the configuration within the server to improve the efficiency and the convenience of the assembly of the server is one of the problems required to be addressed.

SUMMARY OF THE INVENTION

The invention provides a server device, which can simplify the configuration within the server so as to improve the operating efficiency and the convenience of the assembly of the server.

One embodiment of the invention provides a server device including a chassis, a processor assembly, a graphics card assembly and a backplane. The processor assembly is disposed in the chassis. The graphics card assembly is disposed in the chassis. The processor assembly and the graphics card assembly are arranged vertically. The backplane is vertically disposed in the chassis. The processor assembly and the graphics card assembly are electrically connected to the backplane in a board-to-board manner.

According to the server device disclosed by the above embodiments, the processor assembly and the graphics card assembly can be independently plugged, removed or moved due to modular design thereof. In addition, the processor assembly and the graphics card assembly are electrically connected to the backplane vertically disposed in the chassis in a board-to-board manner. Therefore, the assemblies can be electrically connected without multiple cables so as to simplify the configuration within the server device. Accordingly, the operating efficiency and the convenience of the assembly of the server device can be improved.

BRIEF DESCRIPTION OF THE DRAWINGS

The invention will become more fully understood from the detailed description given herein below and the accompanying drawings which are given by way of illustration only and thus are not limitative of the invention and wherein.

DETAILED DESCRIPTION

Figure 1:
FIG. 1 is an exploded view of a server device in accordance with an embodiment of the invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In addition, the terms used in the invention, such as technical and scientific terms, have its own meanings and can be comprehended by those skilled in the art, unless the terms are additionally defined in the invention. That is, the terms used in the following paragraphs should be read on the meaning commonly used in the related fields and will not be overly explained, unless the terms have a specific meaning in the invention.

Figure 2:
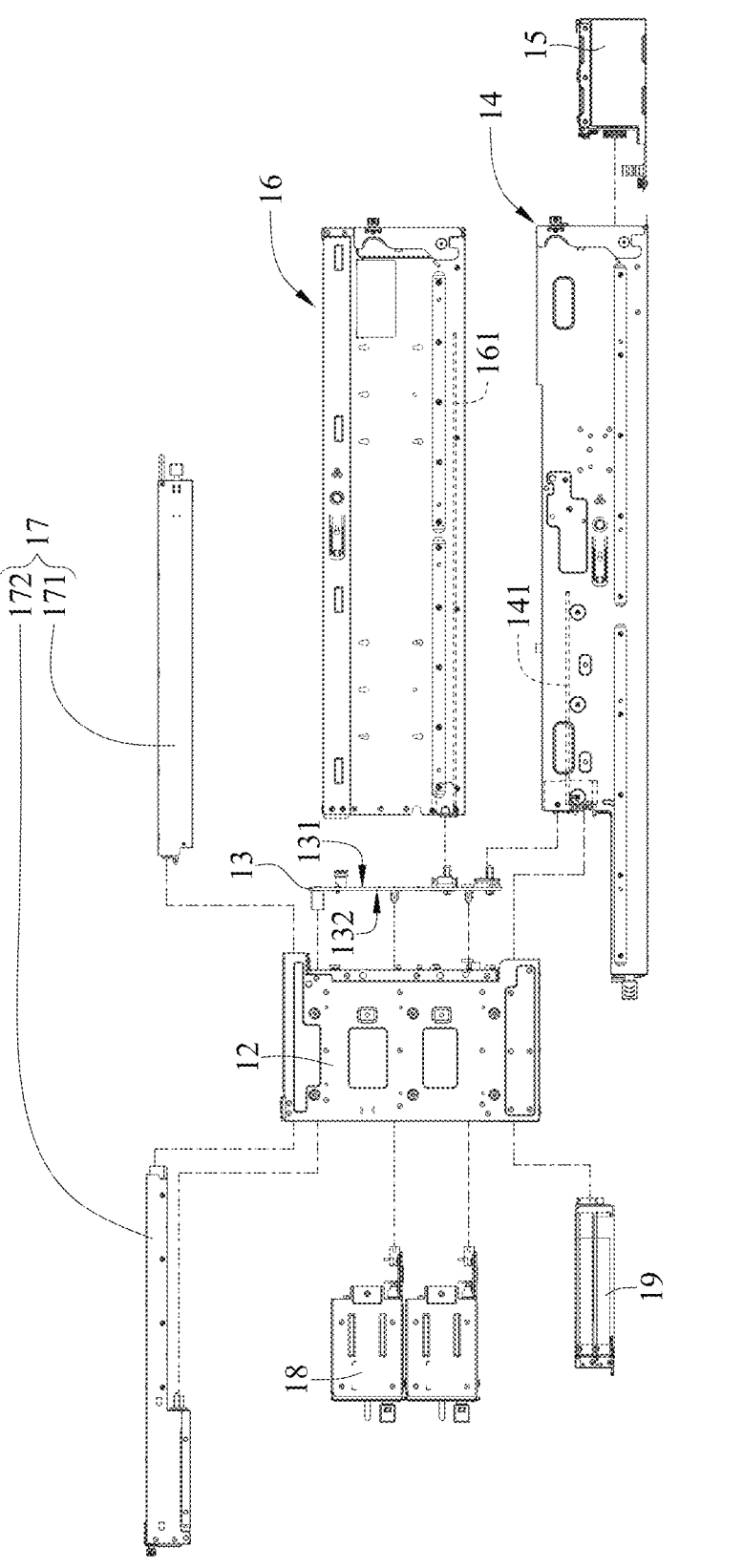
FIG. 2 is an exploded view of the server device in FIG. 1 omitting a chassis.
Figure 3:
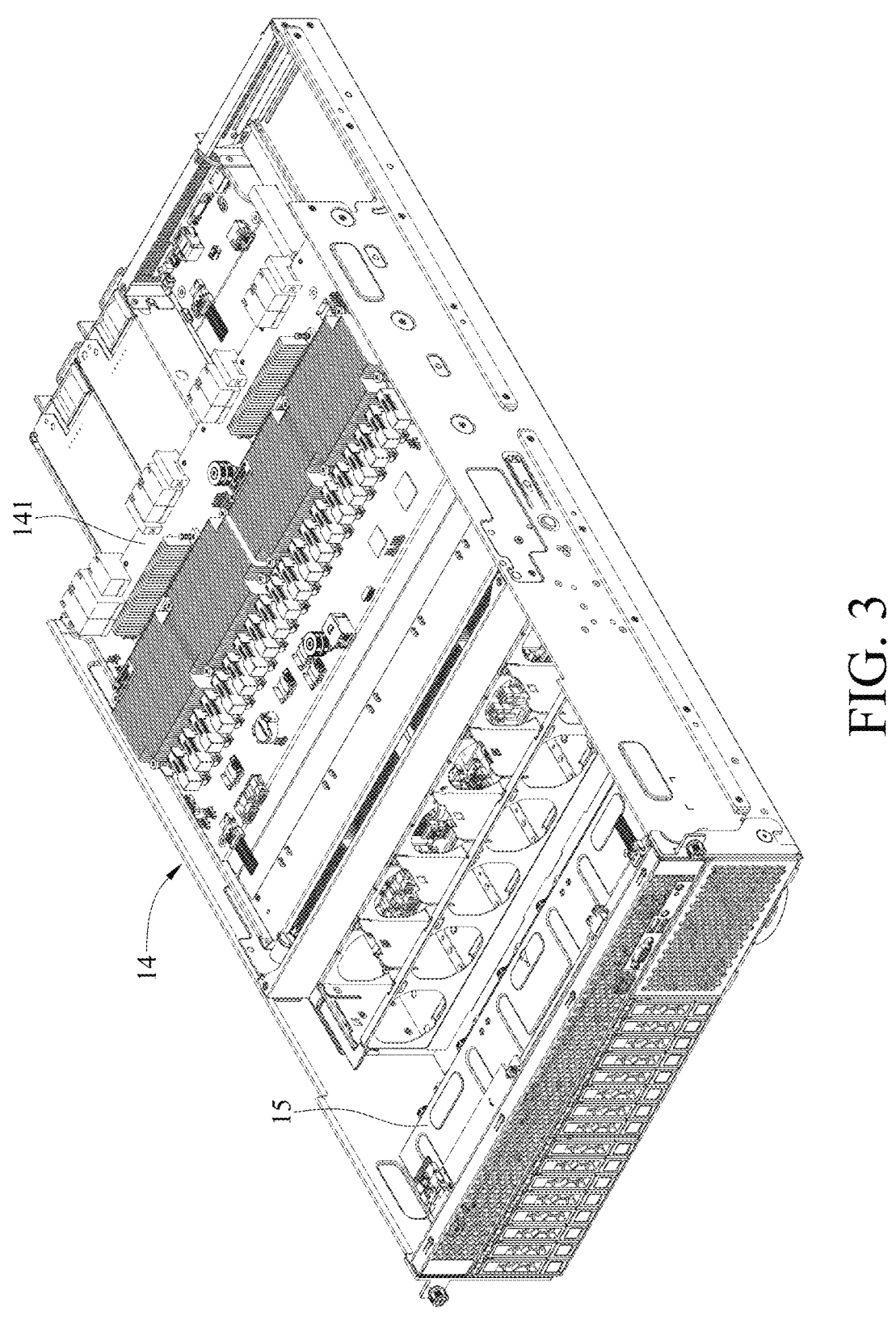
FIG. 3 is a perspective view of a processor assembly of the server device in FIG. 1.
Figure 4:
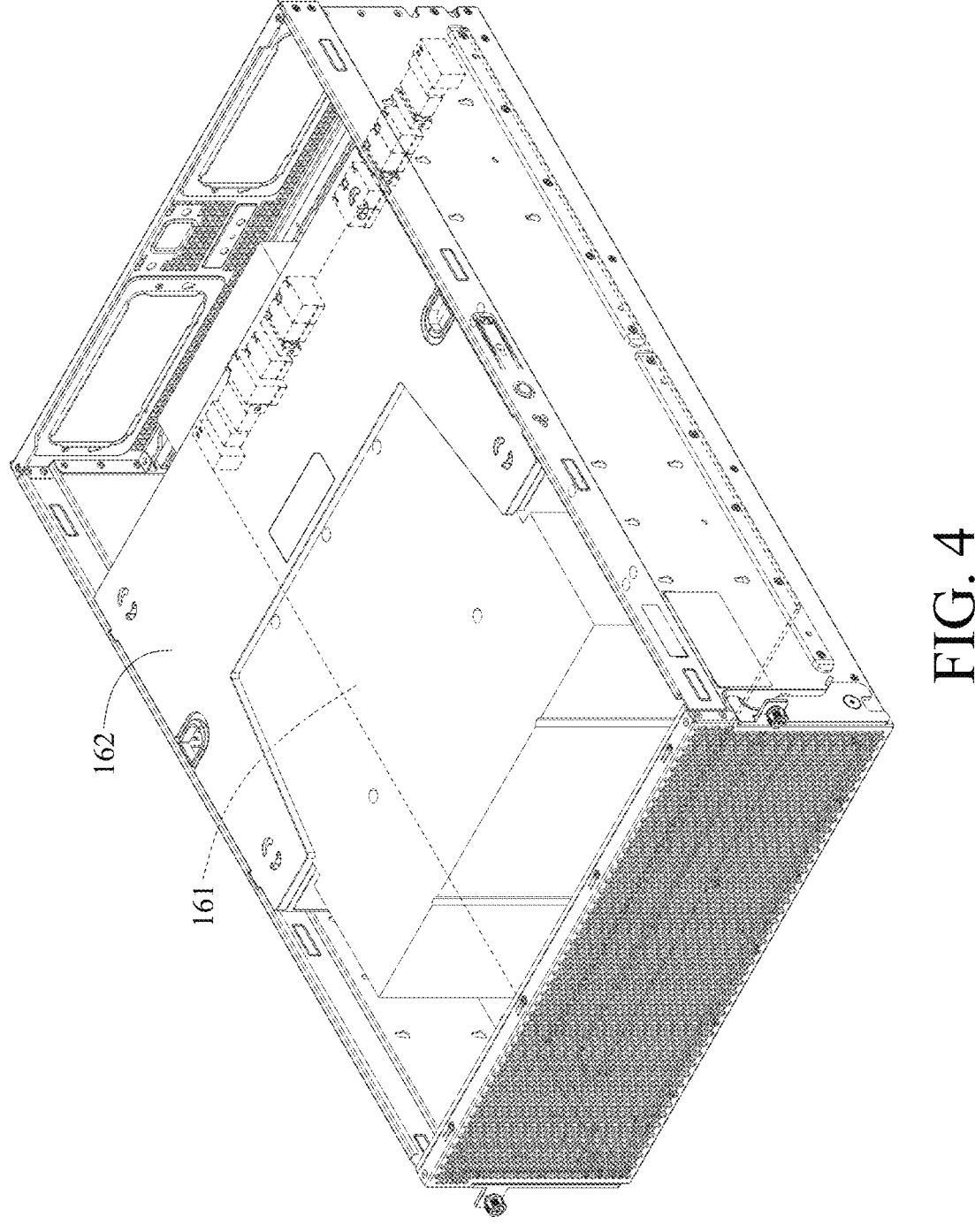
FIG. 4 is a perspective view of a graphics card assembly of the server device in FIG. 1.
Figure 5:
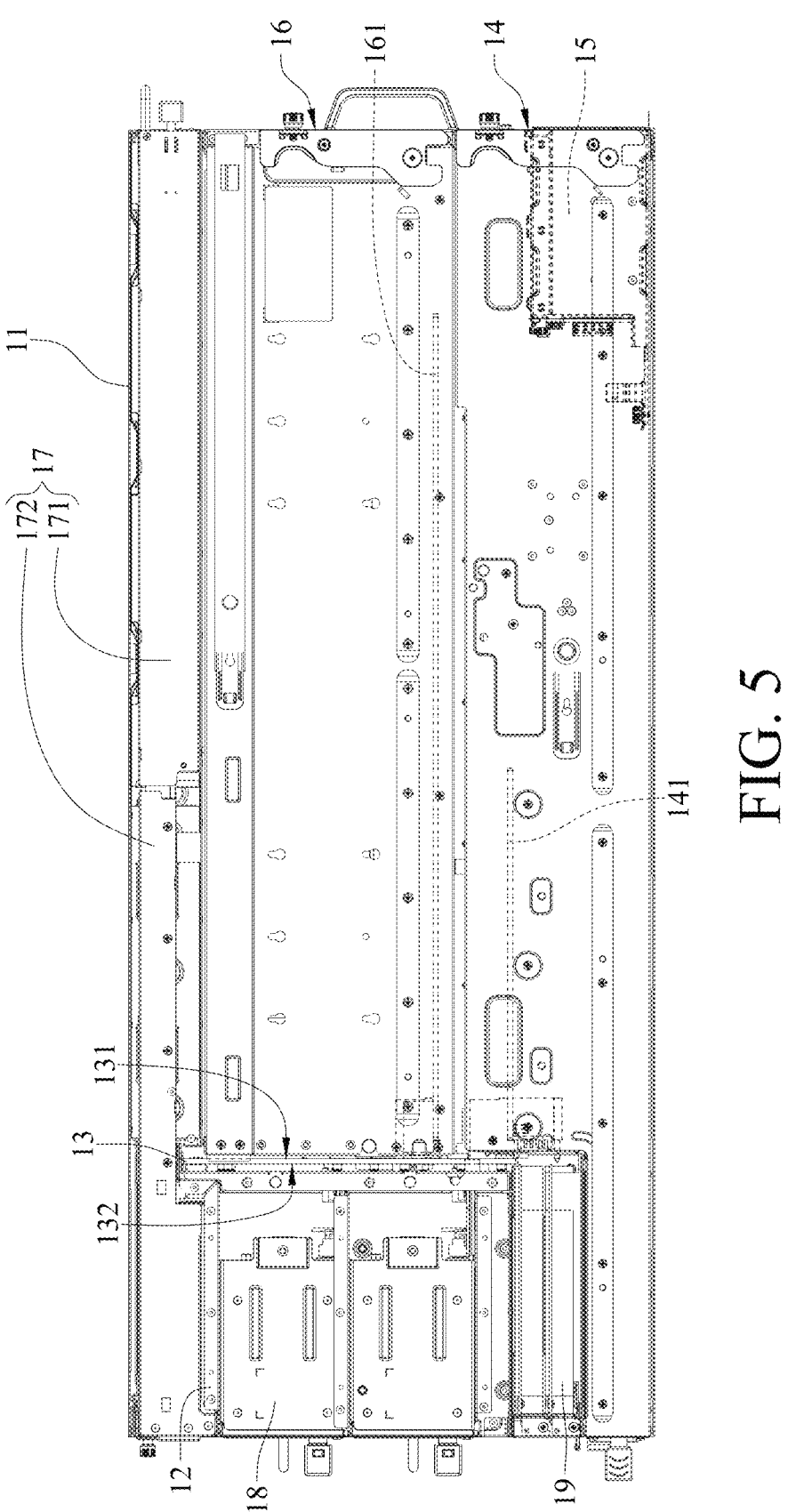
FIG. 5 is a cross-sectional view of the server device in FIG. 1.

Please refer to FIG. 1 to FIG. 5, where FIG. 1 is an exploded view of a server device 10 in accordance with an embodiment of the invention, FIG. 2 is an exploded view of the server device 10 in FIG. 1 omitting a chassis 11, FIG. 3 is a perspective view of a processor assembly 14 of the server device 10 in FIG. 1, FIG. 4 is a perspective view of a graphics card assembly 16 of the server device 10 in FIG. 1, and FIG. 5 is a cross-sectional view of the server device 10 in FIG. 1.

In this embodiment, the server device 10 is, for example, an artificial intelligence server, and is applied to, for example, large-scale training, speech recognition, image classification or machine translation. The server device 10 includes the chassis 11, a mounting cage 12, a backplane 13, the processor assembly 14, a disk drive assembly 15, the graphics card assembly 16, a power supply assembly 17, a fan assembly 18 and a network interface card assembly 19. The mounting cage 12 is disposed in the chassis 11. The backplane 13 is vertically disposed in the chassis 11, and is mounted on the mounting cage 12. The backplane 13 is, for example, a circuit board. The backplane 13 has a first side surface 131 and a second side surface 132. The first side surface 131 faces away from the second side surface 132.

The processor assembly 14 is disposed in the chassis 11, and includes a first riser card 141. The first riser card 141 is disposed at the first side surface 131, and is electrically connected to the backplane 13 via, for example, high-density electrical connectors in a board-to-board manner. The processor assembly 14 is cooled via, for example, one or more built-in fans (not shown) with a specification of 6056. In addition, the first riser card 141 is electrically connected to a circuit board (not shown) of the processor assembly 14 via, for example, cables (not shown). The disk drive assembly 15 is disposed in the processor assembly 14, and is electrically connected to the processor assembly 14. The graphics card assembly 16 is disposed in the chassis 11, and includes a second riser card 161. The second riser card 161 is disposed at the first side surface 131, and is electrically connected to the backplane 13 via, for example, high-density electrical connectors in a board-to-board manner.

The power supply assembly 17 is disposed in the chassis 11. The processor assembly 14, the graphics card assembly 16 and the power supply assembly 17 are arranged vertically. That is, the processor assembly 14, the graphics card assembly 16 and the power supply assembly 17 are independently disposed at different area in the chassis 11. For example, the graphics card assembly 16 is located between the processor assembly 14 and the power supply assembly 17, but the invention is not limited thereto. A normal direction of an extension surface where the first side surface 131 of the backplane 13 is located and a normal direction of an extension surface where the second side surface 132 of the backplane 13 is located are perpendicular to an arrangement direction of the processor assembly 14, the graphics card assembly 16 and the power supply assembly 17. That is, the backplane 13 is disposed at a side of the processor assembly 14, the graphics card assembly 16 and the power supply assembly 17.

The power supply assembly 17 includes a plurality of power supply units 171 and a plurality of power distribution units 172. The power supply units 171 are configured to supply power to other assemblies of the server device 10. The power distribution units 172 are configured to distribute the power to other assemblies of the server device 10. In detail, the power supply units 171 and the power distribution units 172 supply and distribute, for example, 54 volts (V) direct current (DC) power to the graphics card assembly 16, and the power supply units 171 supply, for example, 12V power to the processor assembly 14 directly. The quantity of the power distribution units 172 is greater than the actual required quantity thereof. When some of the power distribution units 172 is/are malfunctioned, the malfunctioned power distribution units 172 can be replaced by the remaining idle power distribution units 172, so that the operation of the power supply assembly 17 is prevented from being interrupted. That is, the power distribution units 172 have a redundant design.

The power distribution units 172 are disposed through the mounting cage 12. The power distribution units 172 are electrically connected to the power supply units 171 and, are electrically connected to the backplane 13 on the second side surface 132 in a board-to-board manner, respectively. The power supply assembly 17 is cooled via, for example, one or more built-in fans (not shown).

The fan assembly 18 is disposed in the mounting cage 12, and corresponds to the graphics card assembly 16. The fan assembly 18 is electrically connected to the backplane 13 on the second side surface 132 via, for example, high-density electrical connectors in a board-to-board manner, and is configured to blow an airflow to cool the graphics card assembly 16. The fan assembly 18 is composed of, for example, a plurality of fans with a specification of 8086 (not shown). The network interface card assembly 19 is disposed in the mounting cage 12, and is located at the second side surface 132. The network interface card assembly 19 is electrically connected to the processor assembly 14 via, for example, high-density electrical connectors in a board-to-board manner. The fan assembly 18 is, for example, located between the network interface card assembly 19 and the power distribution units 172 of the power supply assembly 17.

In this embodiment, the processor assembly 14, the disk drive assembly 15, the graphics card assembly 16, the power supply assembly 17 and the fan assembly 18 can be independently plugged, removed or moved due to modular design thereof. In addition, the processor assembly 14, the disk drive assembly 15, the graphics card assembly 16, the power supply assembly 17 and the fan assembly 18 are electrically connected to the backplane 13 vertically disposed in the chassis 11 in a board-to-board manner. Therefore, the assemblies can be electrically connected without multiple cables so as to simplify the configuration within the server device 10. Accordingly, the operating efficiency and the convenience of the assembly of the server device 10 can be improved.

In addition, the processor assembly 14, the graphics card assembly 16 and the power supply assembly 17 are independently disposed at different area in the chassis 11. Moreover, the processor assembly 14, the graphics card assembly 16 and the power supply assembly 17 are cooled via different fans, respectively. That is, the processor assembly 14, the graphics card assembly 16 and the power supply assembly 17 can be cooled independently via different airflows passing thereby. Accordingly, the cooling efficiency of each assembly disposed in the server device 10 can be improved.

In this embodiment, a height of the server device 10 is, for example, 8 U. In detail, a height of the processor assembly 14 is, for example, 3 U, a height of the graphics card assembly 16 is, for example, 3 U, and a height the power supply assembly 17 is, for example, 3 U, but the invention is not limited thereto. In other embodiments, the height the processor assembly, the height of the graphics card assembly and the height of the power supply assembly may be adjusted according to actual requirements.

In this embodiment, the server device 10 includes the chassis 11, the mounting cage 12, the disk drive assembly 15, the power supply assembly 17, the fan assembly 18 and the network interface card assembly 19. The power supply assembly 17 is configured to supply the power to other assemblies of the server device 10. In addition, the processor assembly 14 and the graphics card assembly 16 are cooled via, for example, an air cooling system. An air baffle 162 may be disposed at the second riser card 161 of the graphics card assembly 16 to guide the airflow, thereby improving the cooling efficiency, but the invention is not limited thereto. In other embodiments, the server device may not include the mounting cage, the disk drive assembly, the power supply assembly, the network interface card assembly and the air baffle. In addition, the power may be supplied to each assembly of the server device via, for example, an external power supply. Moreover, the processor assembly and the graphics card assembly may be cooled via, for example, a liquid cooling system.

According to the server device disclosed by the above embodiments, the processor assembly, the disk drive assembly, the graphics card assembly, the power supply assembly and the fan assembly can be independently plugged, removed or moved due to modular design thereof. In addition, the processor assembly, the disk drive assembly, graphics card assembly, a power supply assembly and a fan assembly are electrically connected to the backplane vertically disposed in the chassis in a board-to-board manner. Therefore, the assemblies can be electrically connected without multiple cables so as to simplify the configuration within the server device. Accordingly, the operating efficiency and the convenience of the assembly of the server device can be improved.

In addition, the processor assembly, the graphics card assembly and the power supply assembly are independently disposed at different areas in the chassis. Moreover, the processor assembly, the graphics card assembly and the power supply assembly are cooled via different fans, respectively. That is, the processor assembly, the graphics card assembly and the power supply assembly can be cooled independently via different airflows passing thereby. Accordingly, the cooling efficiency of each assembly disposed in the server device can be improved.

It will be apparent to those skilled in the art that various modifications and variations can be made to the invention. It is intended that the specification and examples be considered as exemplary embodiments only, with the scope of the invention being indicated by the following claims.

What is claimed is:

1. A server device, comprising:
a chassis;
a processor assembly, disposed in the chassis;
a graphics card assembly, disposed in the chassis, wherein the processor assembly and the graphics card assembly are arranged vertically;
a backplane, vertically disposed in the chassis, wherein the processor assembly and the graphics card assembly are electrically connected to the backplane in a board-to-board manner;
a mounting cage, disposed in the chassis, wherein the backplane is disposed at the mounting cage; and
a fan assembly, disposed in the mounting cage, wherein the fan assembly corresponds to the graphics card assembly, and the fan assembly is electrically connected to the backplane in a board-to-board manner.

2. The server device according to claim 1, wherein the backplane has a first side surface and a second side surface, the first side surface faces away from the second side surface, a normal direction of an extension surface where the first side surface is located and a normal direction of an extension surface where the second side surface is located are perpendicular to an arrangement direction of the processor assembly and the graphics card assembly, the processor assembly and the graphics card assembly are disposed at the first side surface, and the fan assembly is disposed at the second side surface.

3. The server device according to claim 2, further comprising a power supply assembly, wherein the power supply assembly is disposed in the chassis, the processor assembly, the graphics card assembly and the power supply assembly are arranged vertically, and the power supply assembly is electrically connected to the backplane.

4. The server device according to claim 3, wherein the graphics card assembly is located between the processor assembly and the power supply assembly.

5. The server device according to claim 3, wherein the processor assembly comprises a first riser card, the first riser card is disposed at the first side surface, and the first riser card is electrically connected to the backplane in a board-to-board manner.

6. The server device according to claim 3, further comprising a network interface card assembly, wherein the network interface card assembly is disposed in the mounting cage, the fan assembly is located between the network interface card assembly and the power supply assembly, the network interface card assembly disposed at the second side surface, and the network interface card assembly is electrically connected to the processor assembly in a board-to-board manner.

7. The server device according to claim 6, wherein the graphics card assembly comprises a second riser card, the second riser card is disposed at the first side surface, and the second riser card is electrically connected to the backplane in a board-to-board manner.

8. The server device according to claim 3, wherein the power supply assembly comprises at least one power supply unit and at least one power distribution unit, the at least one power distribution unit is electrically connected to the at least one power supply unit, and the at least one power distribution unit is electrically connected to the backplane in a board-to-board manner.

9. The server device according to claim 1, further comprising a disk drive assembly, wherein the disk drive assembly is disposed in the processor assembly, and the disk drive assembly is electrically connected to the processor assembly.

* * * * *